United States Patent
Nanjo

(10) Patent No.: US 7,325,692 B2
(45) Date of Patent: Feb. 5, 2008

(54) CASSETTE HAVING SEPARATION PLATES FOR STORING A PLURALITY OF SEMICONDUCTOR WAFERS

(75) Inventor: Masatoshi Nanjo, Tokyo (JP)

(73) Assignee: Disco Corporation, Tokyo (JP)

( * ) Notice: Subject to any disclaimer, the term of this patent is extended or adjusted under 35 U.S.C. 154(b) by 52 days.

(21) Appl. No.: 10/469,047

(22) PCT Filed: Nov. 26, 2002

(86) PCT No.: PCT/JP02/12313

§ 371 (c)(1),
(2), (4) Date: Aug. 26, 2003

(87) PCT Pub. No.: WO2004/049430

PCT Pub. Date: Jun. 10, 2004

(65) Prior Publication Data

US 2004/0256284 A1    Dec. 23, 2004

(51) Int. Cl.
B65D 85/30   (2006.01)
B05C 13/02   (2006.01)
A47G 19/08   (2006.01)

(52) U.S. Cl. ............... 206/710; 118/500; 118/728; 206/454; 211/41.18

(58) Field of Classification Search ........... 206/710, 206/303, 445, 454; 211/41.18; 118/500, 118/720–721, 728; 414/416.01, 416.03, 414/416.08, 937–938
See application file for complete search history.

(56) References Cited

U.S. PATENT DOCUMENTS

| | | | | |
|---|---|---|---|---|
| 5,131,546 A | * | 7/1992 | Kodera | 211/41.18 |
| 5,219,079 A | * | 6/1993 | Nakamura | 211/41.18 |
| 5,377,476 A | | 1/1995 | Böhmer et al. | |
| 6,093,644 A | * | 7/2000 | Inaba et al. | 206/710 |
| 6,156,121 A | * | 12/2000 | Hasebe et al. | 118/500 |
| 6,310,328 B1 | * | 10/2001 | Gat | 118/728 |

FOREIGN PATENT DOCUMENTS

| | | |
|---|---|---|
| CN | 1371527 | 9/2002 |
| EP | 0 617 573 | 9/1994 |
| JP | 63-178541 | 7/1988 |
| JP | 6-287694 | 10/1994 |
| JP | 2000-34570 | 2/2000 |
| JP | 2000-91400 | 3/2000 |
| WO | 01/01828 | 1/2001 |
| WO | 01/26140 | 4/2001 |
| WO | WO 2004/049430 | 6/2004 |

OTHER PUBLICATIONS

China Patent First Office Action dated Apr. 7, 2006.

* cited by examiner

Primary Examiner—Bryon P. Gehman
(74) Attorney, Agent, or Firm—Smith, Gambrell & Russell, LLP

(57) ABSTRACT

A cassette for storing a plurality of semiconductor wafers with a space in the vertical direction has a plurality of support plates which are provided spaced apart from one another in the vertical direction. A receiving cut-out having a shape corresponding to the shape of an adsorber for suction-holding a semiconductor wafer are formed in the front half portion of each of the support plates. The cassette further comprises separation plates between adjacent support plates.

3 Claims, 6 Drawing Sheets

(A)

(B)

(C)

CASSETTE HAVING SEPARATION PLATES FOR STORING A PLURALITY OF SEMICONDUCTOR WAFERS

FIELD OF TECHNIQUE

The present invention relates to a cassette for storing a plurality of semiconductor wafers with a space therebetween in the vertical direction.

TECHNICAL BACKGROUND

As well known to persons skilled in the art, when a semiconductor is ground or cut, a plurality of semiconductor wafers are stored in a cassette, and the cassette is carried to a predetermined site. The cassette has a pair of side walls extending vertically at an interval therebetween in the crosswise direction, and in the inner sides of the side walls, support ribs or support grooves are formed with a space therebetween in the vertical direction. The semiconductor wafers are each stored in the cassette by positioning their both edge portions on the respective support ribs or in the respective support grooves of both the side walls. Therefore, a plurality of semiconductor wafers are stored with a space therebetween in the vertical direction (the space corresponds to an interval between adjacent support ribs or support grooves) in the cassette. An adsorber having suction holes in its top surface is used to carry semiconductor wafers into the cassette or to carry them out from it. To carry a semiconductor wafer into the cassette, the semiconductor wafer is vacuum adsorbed to the adsorber and carried to a predetermined position in the cassette, the vacuum adsorption of the semiconductor wafer is then released to leave the semiconductor wafer in the cassette, and the adsorber is pulled out from the cassette. To carry a semiconductor wafer out from the cassette, the adsorber is put into the cassette, positioned under the semiconductor wafer to vacuum adsorb the semiconductor wafer, and then, the adsorber suction-holding the semiconductor wafer is pulled out from the cassette.

The above conventional cassette, however, involves the following problems. That is, the thickness of each semiconductor wafer is often made extremely small, for example, to 100 μm or less, particularly 50 μm or less, in recent years. When a semiconductor wafer having an extremely small thickness is stored in the cassette, it may be bent in a concave form so that its center portion is liable to be displaced in a downward direction. Since the curvature of each semiconductor wafer is not always the same, when the semiconductor wafer bends, the space in the vertical direction between adjacent semiconductor wafers stored in the cassette with a space therebetween in the vertical direction becomes extremely small locally. Therefore, there is a possibility that when the adsorber is inserted into the cassette and positioned under the semiconductor wafer, it may bump into the semiconductor wafer and damage the semiconductor wafer. Further, there is a possibility that when the semiconductor wafer greatly bends, it may come into contact with another semiconductor wafer arranged adjacent thereto in the vertical direction, whereby the semiconductor wafer may be damaged.

JP-A 2000-91400 discloses a cassette provided with a plurality of support plates arranged with a space therebetween in the vertical direction to define a plurality of semiconductor wafer storage spaces in the cassette. Each of the support plates has a cut-out correspondent to the shape of an adsorber for suction-holding a semiconductor wafer. In the cassette, each semiconductor wafer is supported not only at its both edge portions but also at its center portion, thereby suppressing its curvature caused by its own weight. As semiconductor wafers adjacent to each other in the vertical direction are separated from each other by the support plate, they are not contacted to each other.

However, the cassette disclosed by the above JP-A 2000-91400 remains yet not satisfactory. According to the experience of the inventor of the present invention, a semiconductor wafer which has been made very thin by grinding its back surface is bent in a concave or convex form due to grinding distortion or crystal orientation. Therefore, even when the semiconductor wafer is supported at its both edge portions and its center portion, the semiconductor wafer is curved. Accordingly, even when the cassette disclosed by JP-A 2000-91400 is used, there still exists a possibility that the adsorber may bump into the semiconductor wafer and damage it, at the time when the adsorber is inserted into the cassette.

DISCLOSURE OF THE INVENTION

It is therefore an object of the present invention to provide a novel and improved cassette which prevents a semiconductor wafer from being damaged by bumping into an adsorber sufficiently surely when the semiconductor wafer is carried into, or out from, the cassette even if the semiconductor wafer is bent in a concave or convex form.

According to the present invention, to attain the above object, a plurality of support plates are provided spaced apart from one another in the vertical direction and further, separation plates are provided between adjacent support plates.

That is, according to the present invention, there is provided a cassette for storing a plurality of semiconductor wafers with a space therebetween in the vertical direction, comprising a plurality of support plates which are provided spaced apart from one another in the vertical direction and have a receiving cut-out correspondent to the shape of an adsorber for suction-holding a semiconductor wafer in the front half portions of the surface plates, wherein separation plates are provided between adjacent support plates.

Preferably, the separation plates are plates having a shape correspondent to the shape of the semiconductor wafer.

Preferably, the cassette comprises a top plate above the uppermost support plate and a bottom plate under the lowest positional support plate.

BEST MODE FOR CARRYING OUT THE INVENTION

A preferred embodiment of a cassette constituted according to the present invention will be described in detail hereinafter with reference to the accompanying drawings.

Figure 1:
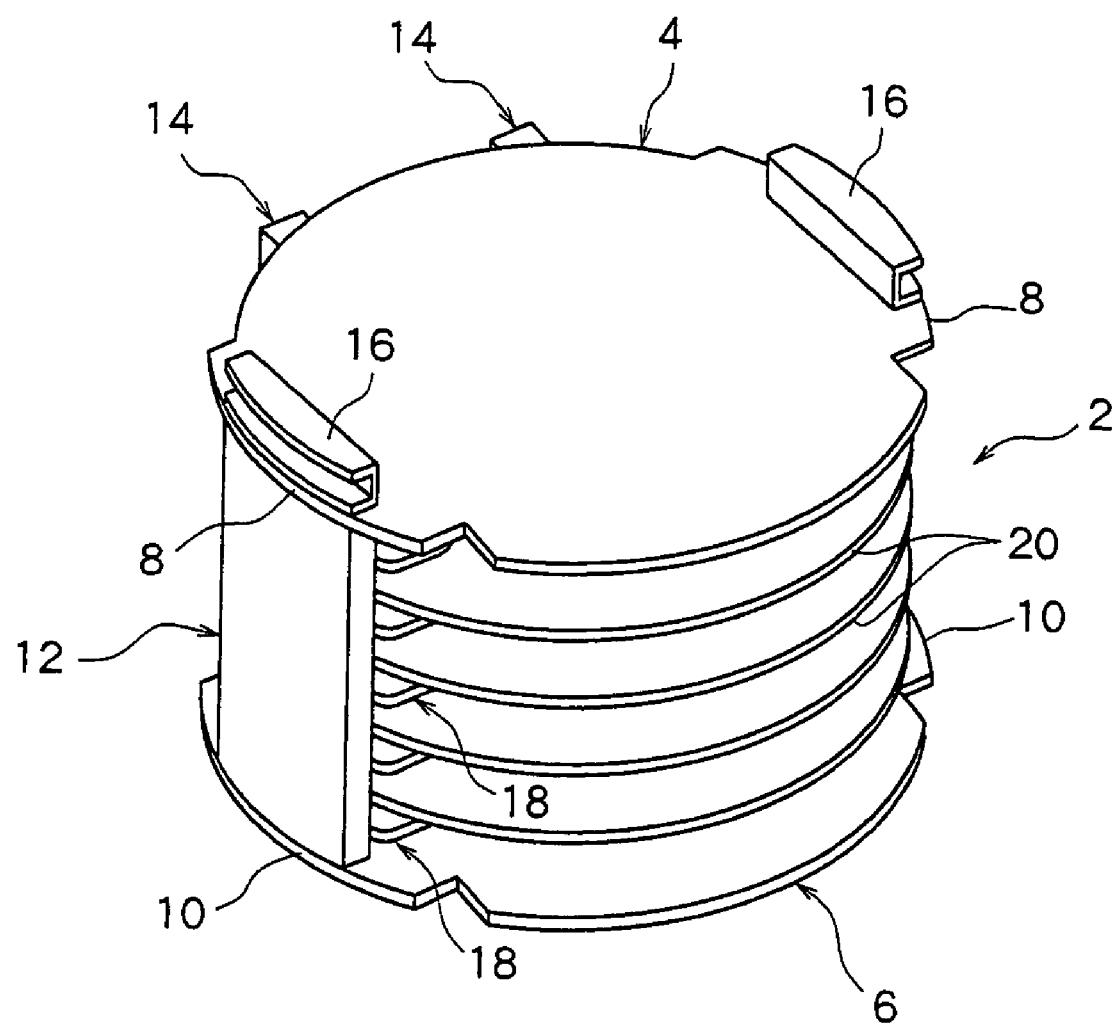
FIG. 1 is a perspective view of a cassette constituted according to the present invention.
Figure 2:
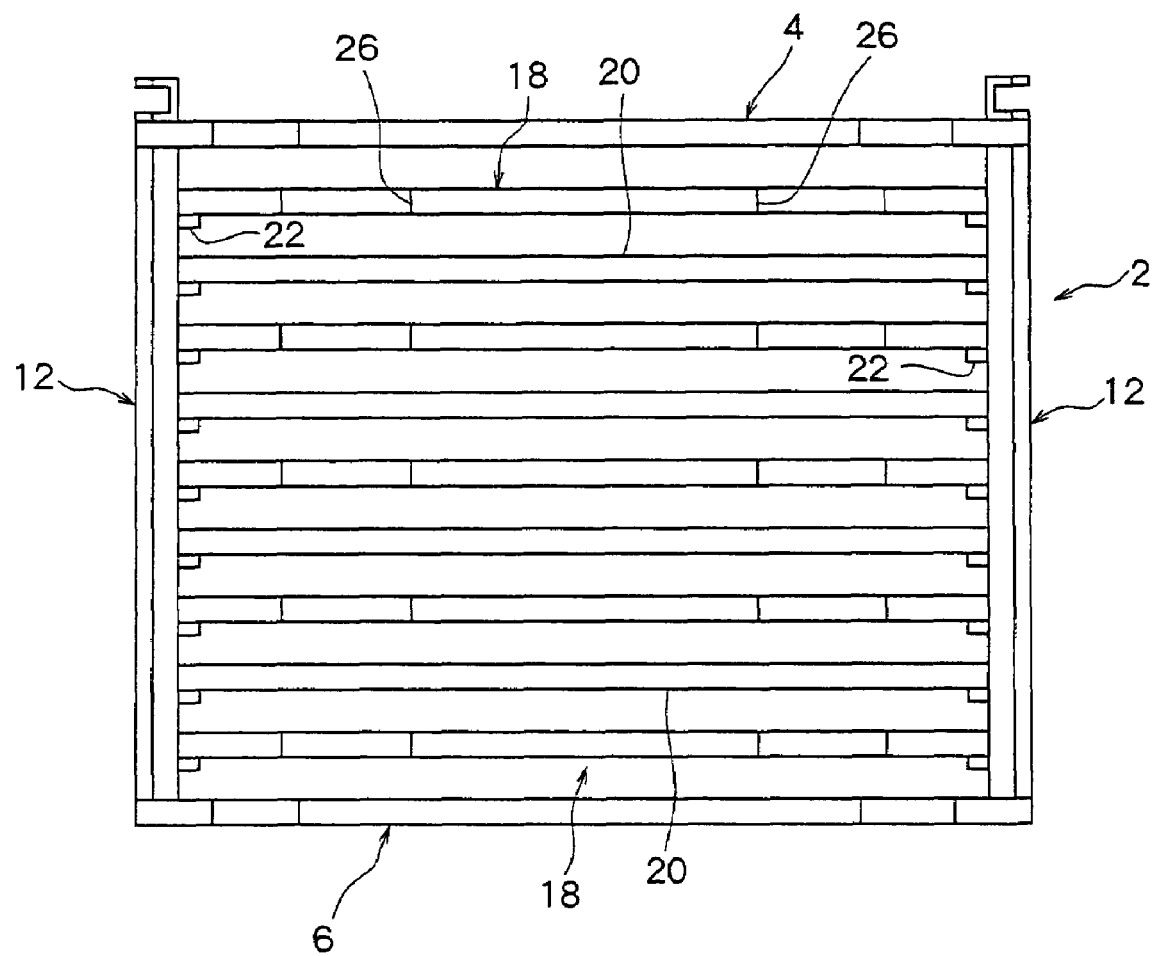
FIG. 2 is a front view of the cassette of FIG. 1.

Referring to FIG. 1 and FIG. 2, a cassette denoted by reference numeral 2 as a whole and constituted according to the present invention comprises a top plate 4 and a bottom plate 6. The top plate 4 has a substantially disk-like shape and an arcuate projection portion 8 at both sides. Similarly, the bottom plate 6 also has a substantially disk-like shape and an arcuate projection portion 10 at both sides. Side walls 12 extending vertically are fixed between the projection portions 8 of the top plate 4 and the projection portions 10 of the bottom plate 6. A pair of rear members 14 extending vertically are secured to the rear ends of the top plate 4 and the bottom plate 6 at an interval therebetween. Grip members 16 having a channel-like cross section are fixed on the respective projection portions 8 of the top plate 4. To carry the cassette 2 manually or by a proper carrying means (not shown), the grip portions 16 may be held.

Figure 3:
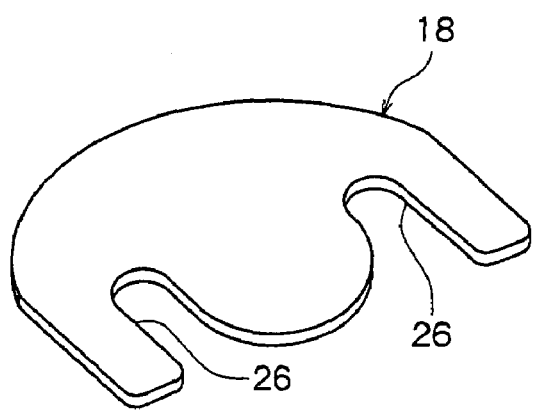
FIG. 3 is a perspective view of a support plate in the cassette of FIG. 1.
Figure 4:
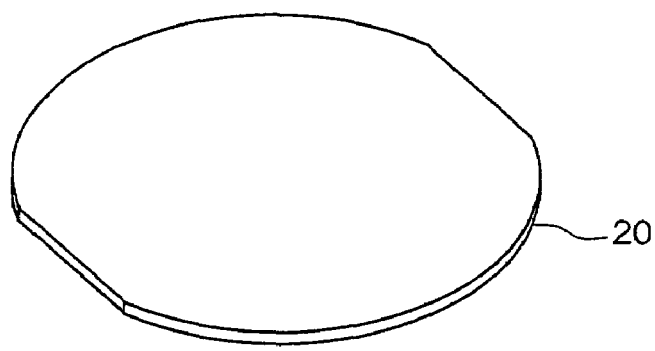
FIG. 4 is a perspective view of a separation plate in the cassette of FIG. 1.
Figure 5:
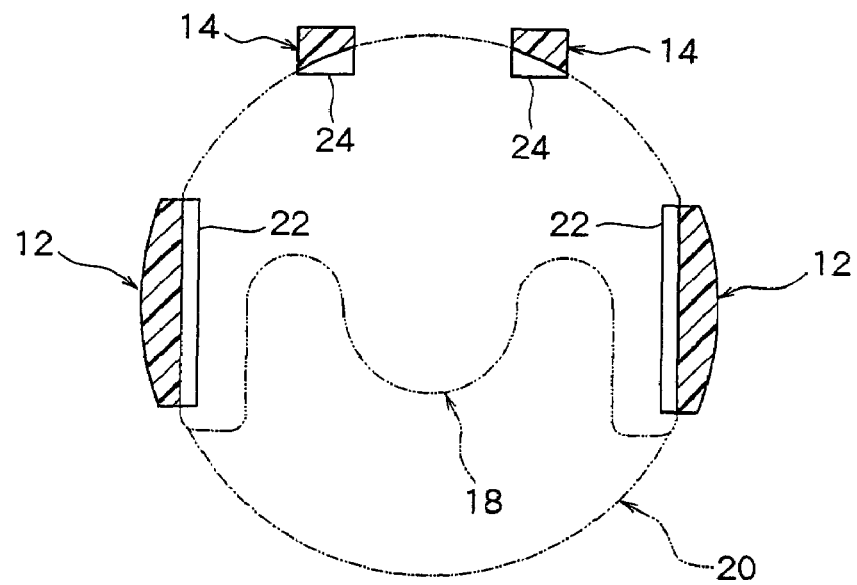
FIG. 5 is a sectional view of side walls and rear members of the cassette of FIG. 1.

A plurality of (5 plates in the illustrated embodiment) of support plates 18 are provided, with a predetermined space therebetween in the vertical direction, between the top plate 4 and the bottom plate 6. Separation plates 20 are provided between each of adjacent support plates 18. Describing in more detail with reference to FIGS. 3 to 5 together with FIG. 1 and FIG. 2, a plurality of (9 pieces in the illustrated embodiment) of support ribs 22 are formed on the inner sides of the side walls 12 with a predetermined space therebetween in the vertical direction. Similarly, a plurality of (9 pieces in the illustrated embodiment) of support ribs 24 are formed on the inner sides of the rear members 14 with a predetermined space therebetween in the vertical direction. The support plates 18 are situated at predetermined positions by fixing their peripheries on odd-numbered ribs 22 and 24 from the top, and the separation plates 20 are situated at predetermined positions by fixing their peripheries on even-numbered ribs 22 and 24 from the top. As clearly shown in FIG. 3, each of the support plates 18 is substantially semi-circular, its both side portions are made linear along the inner surfaces of the side walls 12, and a receiving cut-out 26 correspondent to the shape of an adsorber to be described later are formed in its front half portion. As shown in FIG. 4, each of the separation plates 20 has a substantially disk-like shape correspondent to the shape of the semiconductor wafer, and its both side portions are made linear along the inner surfaces of the side walls 12.

The cassette 2 as described above can be manufactured favorably by forming its constituent elements (that is, the top plate 3, bottom plate 6, side walls 12, rear members 14, grip members 16, support plates 18 and separation plates 20) from a synthetic resin or metal sheet and joining them together by a suitable means such as an adhesive.

Figure 6:
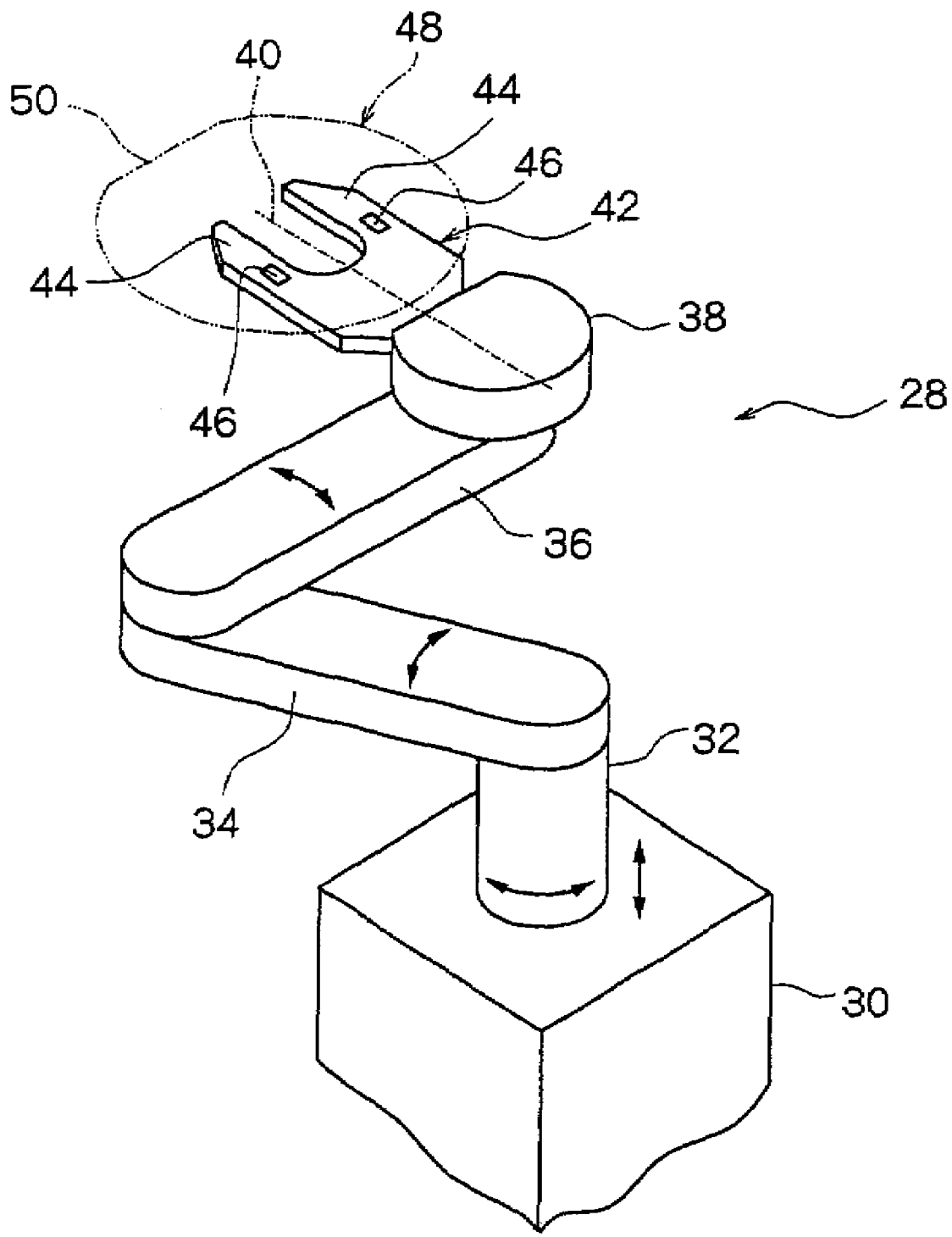
FIG. 6 is a perspective view of a typical example of a semiconductor wafer carrying means.

FIG. 6 shows a typical example of a semiconductor wafer carrying means 28 used to carry a semiconductor wafer into, and out from, the cassette 2. The illustrated semiconductor wafer carrying means 28 which is known per se comprises a lift shaft 32 mounted on a base 30 so as to be able to ascend and descend, a first swing arm 34 rotatably mounted on the top end of the lift shaft 32, a second swing arm 36 rotatably mounted on the end of the first swing arm 34, a mounting block 38 secured to the end of the second swing arm 36, and an adsorber 42 turnably mounted to the mounting block 38 on a central axis 40 extending substantially horizontally as the center. The illustrated adsorber 42 has a bifurcate fork-like form, and porous suction pieces 46 are formed in the respective suction surfaces (top surfaces in FIG. 6) of two fingers 44. Another suitable adsorber may be used as desired, and it is important that the shape of the receiving cut-out 26 in the support plate 18 should correspond to the shape of the adsorber in use. The semiconductor wafer carrying means 28 is provided with a lifting means (not shown) for vertically moving the lift shaft 32, the first swinging means (not shown) for swinging the first swing arm 34, the second swinging means (not shown) for swinging the second swing arm 36 and a rotary means (not shown) for rotating the adsorber 42. Further, it is further provided with a suction means for communicating the suction pieces 46 of the adsorber 42 with a vacuum source selectively.

The semiconductor wafer 48 has a substantially disk-like shape and a linear edge 50 called an "orientation flat" at part of its periphery. To carry the semiconductor wafer 48 by the semiconductor wafer carrying means 28, the suction surface of the adsorber 42 is brought into a close contact with one side of the semiconductor wafer 48 to communicate the suction pieces 46 with the vacuum source, thereby causing the adsorber 42 to adsorb the semiconductor wafer 48.

For instance, to pickup the semiconductor wafer 26 whose back surface has been ground, from a chuck means of a grinding machine (not shown), the adsorber 42 of the semiconductor wafer carrying means 28 is rotated at 180° from the state shown in FIG. 6 to direct the suction surface having the suction pieces 46 downward. The suction surface of the adsorber 42 is pressed against the faced-up back side of the semiconductor wafer 48 on the chuck means to adsorb the semiconductor wafer 48 thereto.

Figure 7:
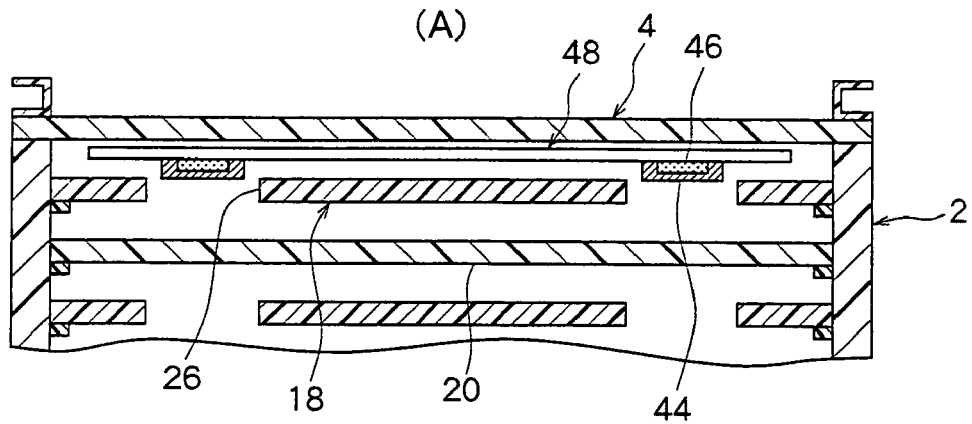
FIG. 7 are sectional views for explaining how to carry a semiconductor wafer into the cassette of FIG. 1.
Figure 7:
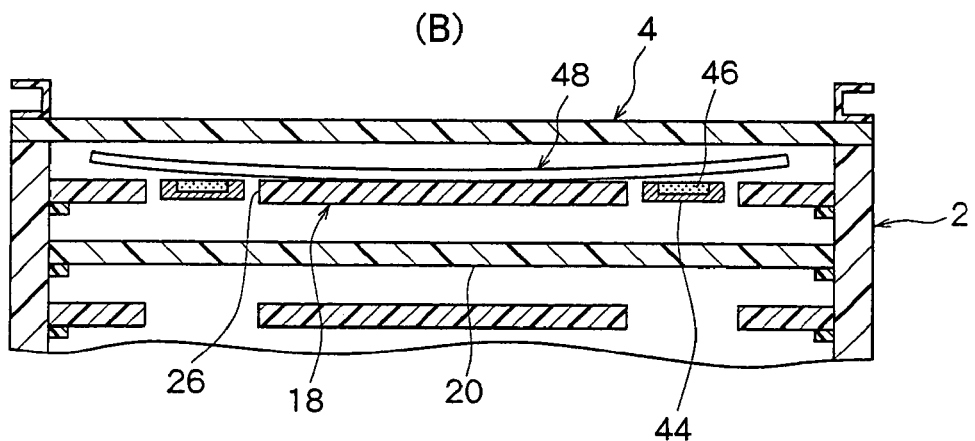
Figure 7:
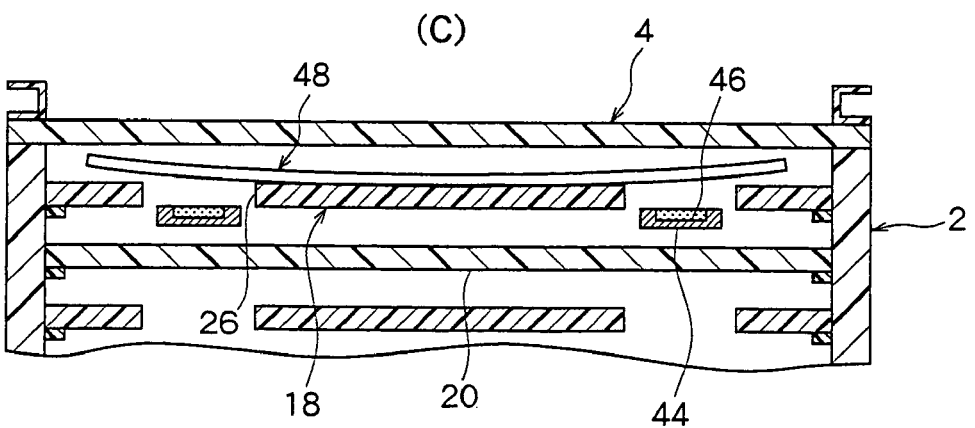

FIG. 7 show an example of how to carry the semiconductor wafer 48 that has been adsorbed to the adsorber 42, onto the support plate 18 locating at the uppermost top position of the cassette 2. To carry the semiconductor wafer 48 into the cassette 2, after the semiconductor wafer 48 is adsorbed to the suction surface of the adsorber 42 and taken out from the chuck means, the adsorber 42 is rotated at 180° to direct the suction surface adsorbing the semiconductor wafer 48 upward. Thereafter, as shown in FIG. 7(A), the adsorber 42 and the semiconductor wafer 48 adsorbed to the suction surface thereof are inserted into the cassette 2 by aligning the two fingers 44 of the adsorber 42 with the respective receiving cut-out 26 of the support plate 18 and positioning the semiconductor wafer 48 above the support plate 18. Subsequently, the suction pieces 46 of the adsorber 42 are disconnected from the vacuum source and opened to the air to stop the adsorption of the semiconductor wafer 48. Then, the adsorber 42 is lowered. When the adsorber 42 is lowered up to the position shown in FIG. 7(B), the semiconductor wafer 48 is placed on the support plate 18. When the adsorption of the semiconductor wafer 48 by the suction pieces 46 is stopped, if the semiconductor wafer 48 is extremely thin, for example as shown in FIG. 7(B), it tends to be bent in a concave form (or in a convex form in reverse) due to grinding distortion or crystal orientation. Then, as shown in FIG. 7(C), the adsorber 42 is further lowered a bit to separate the semiconductor wafer 48 placed on the support plate 18 therefrom completely. Thereafter, the adsorber 42 is pulled out from the cassette 2. The semiconductor wafer 48 can be carried onto support plates 18 other than the uppermost top support plate 18 in the same manner as above.

Figure 8:
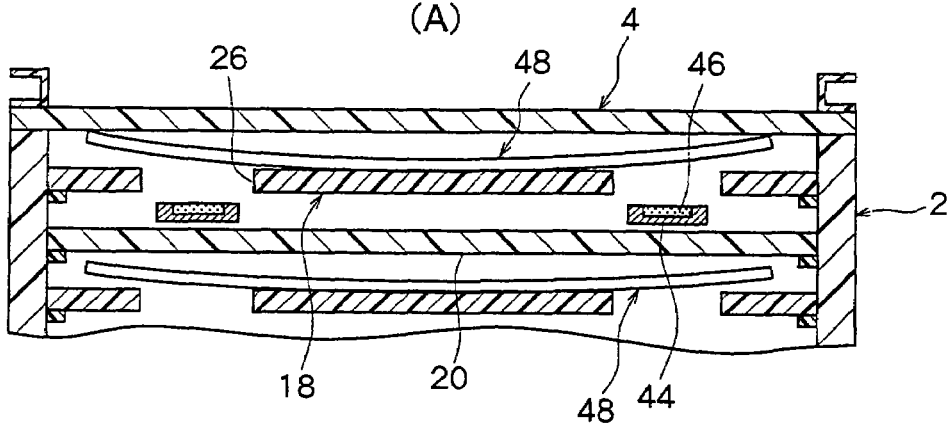
FIG. 8 are sectional views for explaining how to carry a semiconductor wafer out from the cassette of FIG. 1.
Figure 8:
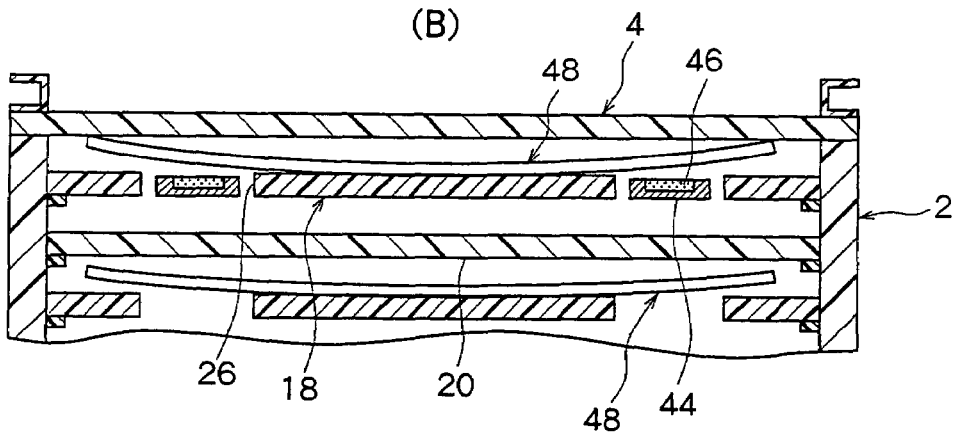
Figure 8:
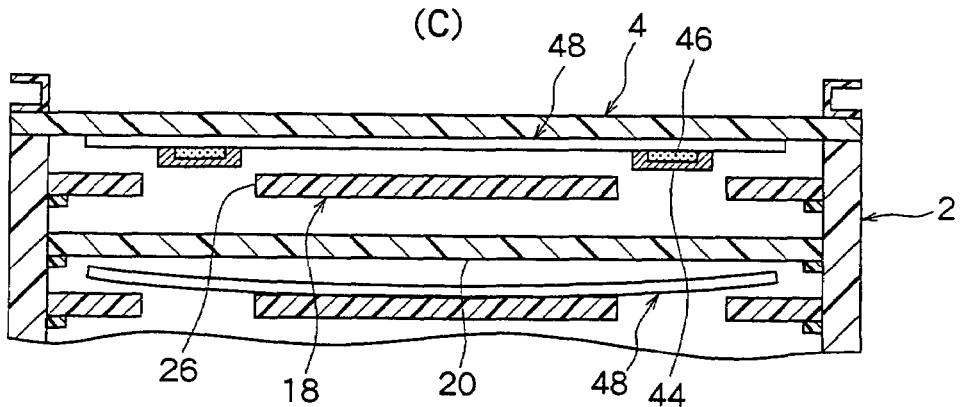

FIG. 8 shows an example of how to carry the semiconductor wafer 48 placed on the uppermost top support plate 18 out from the cassette 2. First, as shown in FIG. 8(A), the adsorber 42 is inserted, in a state of its suction surface face up being maintained, between the uppermost support plate 18 and the separation plate 20 positioned under the support plate 18. Then, as shown in FIGS. 8(B) and 8(C), the adsorber 42 is moved up through the receiving cut-out 26 of the support plate 18. When the adsorber 42 is moved up to the position shown in FIG. 8(C), the semiconductor wafer 48 is pressed against the inner side of the top plate 4 (in the case of a semiconductor wafer 48 positioned under the support plate 18, it is pressed against the inner side of the separation plate 20 positioned above the support plate 18), whereby the curvature of the semiconductor wafer 48 is corrected to make the semiconductor wafer 48 into a flattened state. Thereafter, the suction pieces 46 of the adsorber 42 are communicated with the vacuum source to adsorb the semiconductor wafer 48 to the suction surface. Then, the adsorber 42 is slightly lowered to separate the semiconductor wafer 48 from the inner side of the top plate 4 (or the separation plate 20) and pulled out from the cassette 2 while adsorbing the semiconductor wafer 48.

In the embodiment shown in FIG. 7 and FIG. 8, the adsorber 42 adsorbing the semiconductor wafer 48 is inserted into the cassette 2 in a state of its suction surface face up to place the semiconductor wafer 48 on the support plate 18 of the cassette 2, and when the semiconductor wafer 48 on the support plate 18 is carried out from the support plate 18, too, the adsorber 42 is inserted into the cassette 2 in a state of its suction surface face up. However, as required, the adsorber 2 adsorbing the semiconductor wafer 48 may be inserted into the cassette 2 in a state of its suction surface face down, that is, in a state of the semiconductor wafer 48 being adsorbed to the under side of the adsorber 42, and placed on the separation plate 20 positioned under the support plate 18 and not on the support plate 18. In this case, to carry the semiconductor wafer 48 placed on the separation plate 20 out from the cassette 2, the adsorber 42 may be inserted into the cassette 2 in a state of its suction surface face down.

While the preferred embodiment of the cassette constituted according to the present invention has been described in detail with reference to the accompanying drawings, the present invention is not limited to the above embodiment and it should be understood that various changes and modifications can be made without departing from the spirit and scope of the invention.

The invention claimed is:

1. A cassette for storing a plurality of semiconductor wafers with a space therebetween in the vertical direction of the cassette, comprising a plurality of support plates which are provided spaced apart from one another in the vertical direction, each of said support plates having a front half portion and a receiving cut-out having a bifurcate fork shape correspondent to the shape of an adsorber for suction-holding a semiconductor wafer in the front half portion of each of the support plates, wherein each of said support plates is configured to support a semiconductor wafer at center and edge portions of the semiconductor wafer; further wherein separation plates are provided, each separation plate located between two adjacent support plates, each of the separation plates extending beyond all said edge portions; of a semiconductor wafer disposed on an adjacent support plate.

2. The cassette of claim 1, which comprises a top plate above the uppermost support plate and a bottom plate under the lowest positional support plate.

3. The cassette of claim 1, wherein each separation plate is removably fixed at its periphery on support ribs formed on inner side walls and rear members of the cassette.

* * * * *